United States Patent
Mercke et al.

(10) Patent No.: US 6,810,338 B2
(45) Date of Patent: Oct. 26, 2004

(54) MONITORING CIRCUIT

(75) Inventors: Johan Mercke, Lund (SE); Kristoffer Ptasinski, Lund (SE); Niclas Håkansson, Lund (SE); Bengt Edholm, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 209 days.

(21) Appl. No.: 09/982,801

(22) Filed: Oct. 22, 2001

(65) Prior Publication Data
US 2002/0047797 A1 Apr. 25, 2002

Related U.S. Application Data
(60) Provisional application No. 60/243,439, filed on Oct. 27, 2000.

(30) Foreign Application Priority Data
Oct. 23, 2000 (GB) .............................................. 0025921

(51) Int. Cl.[7] .............................. G06F 19/00; H02J 7/00
(52) U.S. Cl. ...................... 702/63; 320/137; 455/127.1; 455/573
(58) Field of Search ........................... 702/63; 320/137, 320/152, 162; 455/127.1, 572, 573

(56) References Cited
U.S. PATENT DOCUMENTS

| | | |
|---|---|---|
| 3,940,679 A | 2/1976 | Brandwein et al. |
| 4,418,310 A | 11/1983 | Bollinger |
| 4,709,202 A | 11/1987 | Koenck et al. |
| 5,166,623 A | 11/1992 | Ganio |
| 5,434,508 A | 7/1995 | Ishida |
| 5,570,025 A | 10/1996 | Lauritsen et al. |

(List continued on next page.)

FOREIGN PATENT DOCUMENTS

| | | |
|---|---|---|
| DE | 226390 A1 | 8/1985 |
| EP | 0307117 A2 | 3/1989 |
| EP | 0512711 A2 | 11/1992 |
| FR | 2734910 A1 | 12/1996 |
| GB | 2312517 A1 | 10/1997 |
| GB | 2363532 A | 12/2001 |
| JP | 4357467 | 12/1992 |
| JP | 07131410 A | 5/1995 |
| JP | 8032506 | 2/1996 |
| JP | 08171437 A | 7/1996 |
| JP | 08294235 A | 11/1996 |

(List continued on next page.)

OTHER PUBLICATIONS

"World's First Triple Remote Diode Input and Local Digital Sensor Available Now"; Electronic Design, May 1, 2000; National advertisement.

*Primary Examiner*—Patrick Assouad
(74) *Attorney, Agent, or Firm*—Burns, Doane, Swecker & Mathis, L.L.P.

(57) ABSTRACT

There is provided a monitoring device which can be used as a battery monitor in a mobile communications device, such as a mobile phone. The monitoring device includes output registers, from which parameter values can be read by a processor unit.

Advantageously, the device makes frequent measurements, and updates parameter values on the basis of those measurements. The updated stored parameter values can then be read by the processor. This has the advantage that the processor does not have to read a large number of values, in order to obtain the information required about the parameters. This therefore has the result that communications on the bus are reduced, and power consumption is reduced.

For example, the parameters may include a maximum battery voltage, a minimum battery voltage, and an average battery voltage, as well as parameters relating to the current supplied to the battery during charging.

51 Claims, 2 Drawing Sheets

U.S. PATENT DOCUMENTS

| | | | | |
|---|---|---|---|---|
| 5,684,387 | A | * 11/1997 | Patino | 320/106 |
| 5,717,312 | A | 2/1998 | Maeda et al. | |
| 5,717,314 | A | * 2/1998 | Wakefield | 320/150 |
| 5,774,733 | A | * 6/1998 | Nolan et al. | 713/300 |
| 5,796,239 | A | 8/1998 | van Phuoc et al. | |
| 5,841,996 | A | * 11/1998 | Nolan et al. | 710/305 |
| 5,883,493 | A | 3/1999 | Koenck | |
| 5,965,997 | A | * 10/1999 | Alwardi et al. | 320/132 |
| 6,016,018 | A | 1/2000 | Hasegawa et al. | |
| 6,047,380 | A | * 4/2000 | Nolan et al. | 713/324 |
| 6,081,154 | A | * 6/2000 | Ezell et al. | 327/540 |
| 6,134,457 | A | * 10/2000 | Ha et al. | 455/572 |
| 6,173,350 | B1 | * 1/2001 | Hudson et al. | 710/100 |
| 6,211,647 | B1 | * 4/2001 | Wendelrup et al. | 320/112 |
| 6,218,809 | B1 | * 4/2001 | Downs et al. | 320/132 |
| 6,259,232 | B1 | * 7/2001 | Douglass et al. | 320/133 |
| 6,314,307 | B1 | * 11/2001 | Charron | 455/573 |
| 6,584,329 | B1 | * 6/2003 | Wendelrup et al. | 455/572 |
| 2001/0009361 | A1 | * 7/2001 | Downs et al. | 320/132 |
| 2002/0101218 | A1 | * 8/2002 | Koenck et al. | 320/140 |

FOREIGN PATENT DOCUMENTS

| | | |
|---|---|---|
| JP | 10149842 A | 6/1998 |
| JP | 10232272 A | 9/1998 |
| JP | 11003153 | 1/1999 |
| JP | 11183532 A | 7/1999 |
| JP | 11-183532 | 7/1999 |
| JP | 7321724 | 12/1999 |
| RU | 1005297 | 2/1981 |
| WO | WO97/01195 | 1/1997 |
| WO | WO99/24842 | 5/1999 |

* cited by examiner

MONITORING CIRCUIT

This application claims priority under 35 U.S.C. §§119 and/or 365 to 0025921.8 filed in the United Kingdom, on Oct. 23, 2000 and Ser. No. 60/243,439 filed in the United States of America on Oct. 27, 2000; the entire content of which is hereby incorporated by reference.

TECHNICAL FIELD OF THE INVENTION

This invention relates to a monitoring circuit, and in particular to a circuit for monitoring a battery voltage, for example in a mobile communications device such as a mobile phone.

BACKGROUND OF THE INVENTION

In operation of a battery-powered mobile communications device, such as a mobile phone, it is useful for a controller of the device to have information about various system parameters, such as the voltage being supplied by the battery. However, if frequent measurements are made by the controller, this requires a large number of measurements to be sent over the internal communication bus of the device, which puts an increased load on the controller, and results in higher power consumption.

U.S. Pat. No. 5,570,025 describes a cellular phone in which, during a call, battery voltage measurements are sent to a CPU for processing.

JP-11-183532 discloses a battery monitoring apparatus with an analog-digital (A/D) converter, which converts a measured battery voltage into a digital signal, and monitors the signal in cycles. The device further includes means for setting a reference voltage, and for comparing the digitized battery voltage with the reference voltage, providing an output interruption signal to the processor when the voltage drops below the reference voltage. Thus, battery monitoring is carried out independently of the processor, until the voltage falls below the preset reference voltage.

Although this system provides a warning when a battery voltage falls below a preset threshold, it does not provide any further information about the condition of the battery.

SUMMARY OF THE INVENTION

In accordance with one aspect of the invention, a monitoring device includes output registers, from which parameter values can be read by a processor unit.

Advantageously, the device makes frequent measurements, and updates parameter values on the basis of those measurements. The updated stored parameter values can then be read by the processor.

This has the advantage that the processor does not have to read a large number of values, in order to obtain the information required about the parameters. This therefore has the result that communications on the bus are reduced, and power consumption is reduced.

For example, the parameters may include a maximum battery voltage, a minimum battery voltage, and an average battery voltage.

Moreover, the monitoring device can be used as a battery monitor in a mobile communications device, such as a mobile phone. In that case, a battery voltage would be expected to change, depending on whether or not the device is transmitting. Separate output registers can therefore be provided for parameters which depend on whether or not the device is transmitting. For example, measured parameters may include a minimum battery voltage while transmitting, a minimum battery voltage while not transmitting, a maximum battery voltage while transmitting, a maximum battery voltage while not transmitting, an average battery voltage while transmitting, and an average battery voltage while not transmitting.

In addition, the monitoring device in accordance with the invention can be used to monitor a battery voltage during battery charging, the maximum battery voltage being of most importance. In that case, a charging current can also be measured, and output registers can be provided for parameters such as a maximum current, minimum current, and average current.

The monitoring device of the present invention can further allow threshold values to be set for any of the measured parameter values, and can automatically send a signal to the processor unit whenever any parameter values passes its respective threshold value.

It should be emphasised that the term "comprises/comprising" when used in this specification is taken to specify the presence of stated features, integers, steps or components but does not preclude the presence or addition of one or more other features, integers, steps, components or groups thereof.

DETAILED DESCRIPTION OF PREFERRED EMBODIMENT

Figure 1:
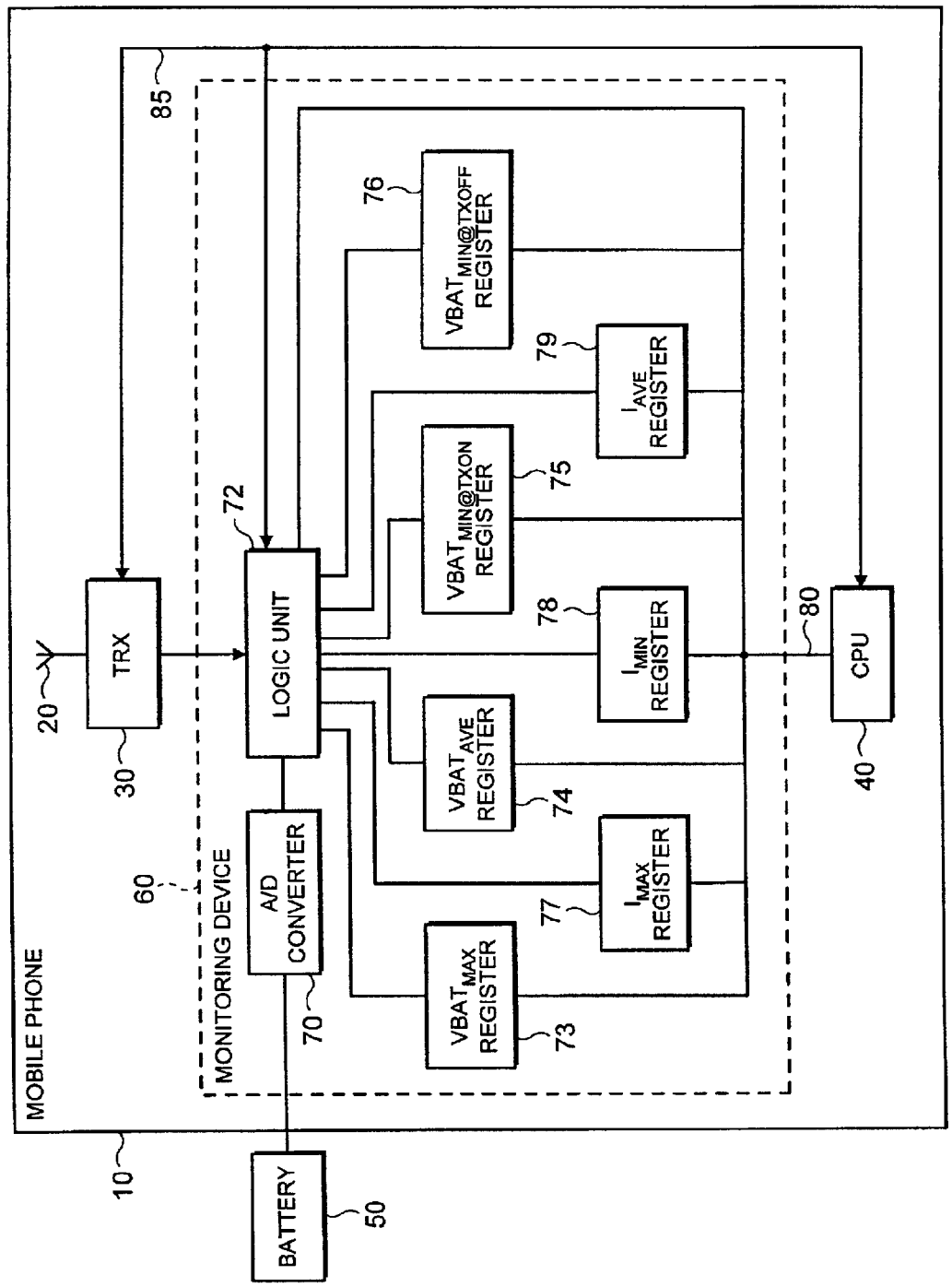
FIG. 1 is a block schematic diagram of a mobile communications device incorporating a monitoring device in accordance with the invention.

FIG. 1 is a block schematic diagram of a mobile communications device. The invention is generally applicable to portable radio communication equipment or mobile radio terminals, such as mobile telephones, pagers, communicators, electronic organisers, smartphones, personal digital assistants (PDAs), portable music devices, or the like.

Specifically, FIG. 1 shows a mobile phone 10 which, as is conventional, has an antenna 20, connected to transceiver circuits 30, which operate under the control of a CPU 40. The mobile phone 10 is powered by a battery 50. The battery 50 is shown in FIG. 1 as being separate from the phone 10. However, it will be apparent that the invention is equally applicable to monitoring the condition of a battery which is built into, or contained within, a portable electronic device.

In accordance with the invention, the mobile phone 10 includes a monitoring device 60, which is connected to the battery 50 to monitor the voltage supplied thereby and, when the battery 50 is being charged, to monitor the charging current being supplied thereto.

The monitoring device 60 includes an A/D converter 70, which receives analog signals relating to the battery voltage and charging current, and converts them into digital form. A logic unit 72 is connected to the A/D converter 70, to receive therefrom the digital signals. The logic unit 72 is also connected to the transceiver circuitry 30 in this illustrated embodiment of the invention.

The logic unit is also connected to supply data to a series of output registers 73–79, as is described in more detail below.

The CPU 40 can access the values stored in the registers 73–79 at any time, retrieving the stored data values on a data bus 80. The logic unit 72 also has a connection to the data bus 80.

Further, the CPU 40, transceiver circuits 30 and logic unit 72 are connected via the internal communications bus 85 of the mobile phone 10, to transmit and receive digital signalling.

Figure 2:
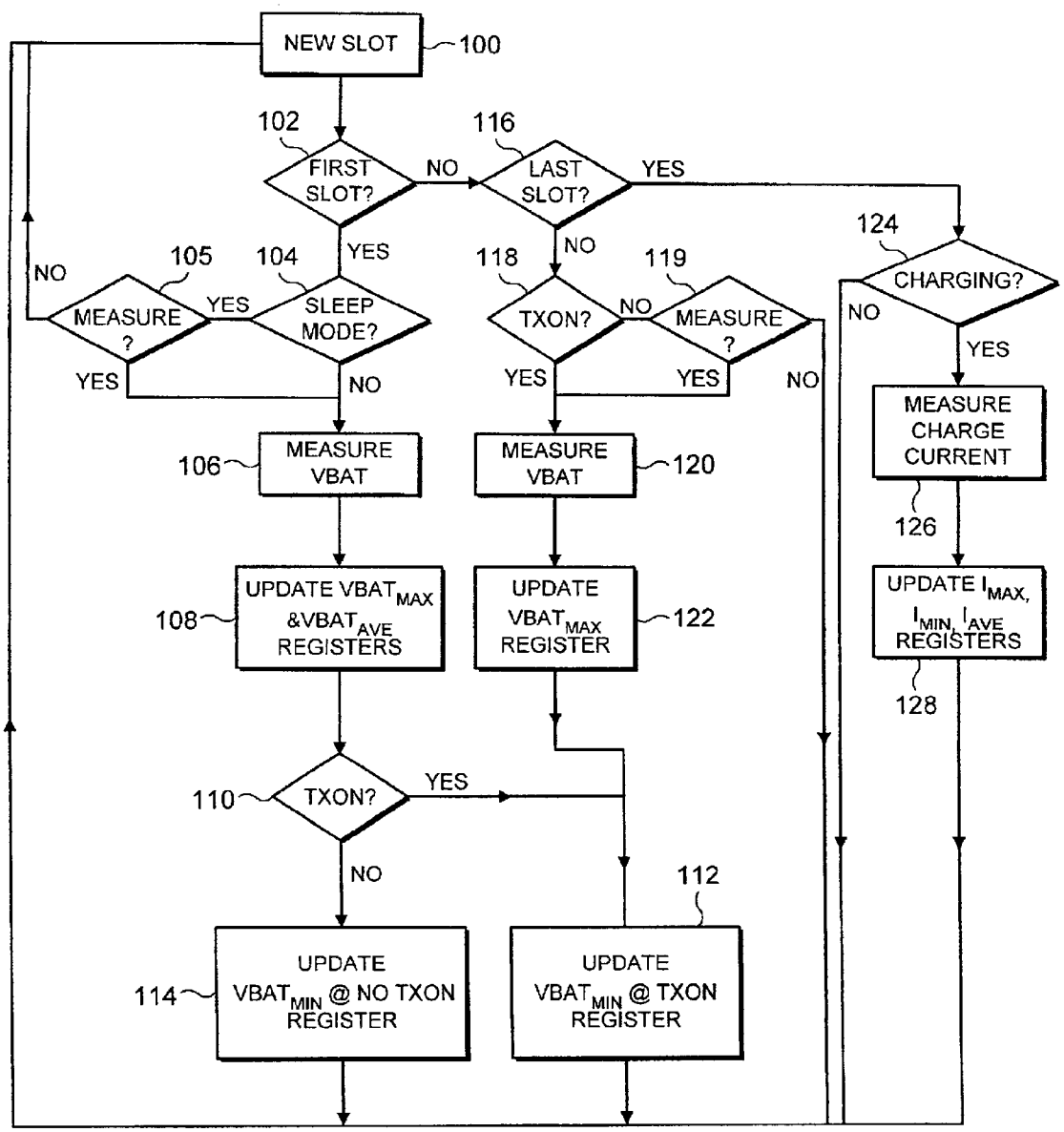
FIG. 2 is a flow chart showing operation of the device in accordance with the invention.

FIG. 2 is a flow chart describing the operation of the logic unit 72, and in particular describing the measurements which are made, namely the inputs which are taken from the A/D converter 70, and the way in which the registers 73–79 are updated.

The logic unit 72 of the monitoring device 60 receives a new slot, step 100. In this illustrated embodiment of the invention, the 100 μs long slots are grouped into sets of 10 slots, allowing some measurements to be made only once in each set of 10 slots, while allowing other measurements at particular modes of operation of the device to be taken more often.

Thus, in step 102, it is determined whether the new slot is the first slot in a set of 10. If so, it is next determined in step 104 whether the phone is in a sleep mode, that is, a mode in which it is switched on, but neither transmitting nor receiving.

If the phone is in a sleep mode, the process passes to step 105, in which it is determined whether or not to make a measurement during that slot. This determination is made on the basis of an adjustable user setting. If the setting is that no measurement is to be made when in the sleep mode, the process returns to the start.

However, if it is determined in step 105 that a measurement should be made, or if it is determined in step 104 that the phone is not in the sleep mode, the procedure passes to step 106, in which the voltage VBAT supplied by the battery is measured.

In step 108, this measured battery voltage can be used to update stored values in one or more of the registers 73–79. Thus, in this case, there is a first register 73 which stores the highest recorded value of the battery voltage $VBAT_{max}$. If the voltage measured in 106 exceeds the value stored in the register 73, it is used to update that stored value.

A second register 74 stores the average voltage which has been supplied by the battery over the preceding second. With one measurement being made every 1000 μs, 1024 successive measurements are added together and divided by 1024, and the resulting average value is stored in the $VBAT_{ave}$ register 74.

As well as the maximum voltage supplied by the battery, another parameter which is of importance is the minimum voltage supplied by the battery. However, since the battery voltage will vary, depending on whether or not the device is transmitting at the time, it is advantageous to store two separate minimum values, namely a first minimum value which was recorded while the device was not transmitting, and a second probably lower minimum value which was recorded during a period while the device was transmitting.

In this illustrated preferred embodiment, the logic unit 72 is connected to the transceiver circuitry 30 to receive therefrom a signal which indicates whether the transmitter is active. This signal is provided by devices which operate in some mobile communications systems, such as GSM. However, it is not provided in all systems. For example, this signal is not present in devices which operate in a Wideband Code Division Multiple Access (W-CDMA) system. Thus, in the case of a device which operates only in accordance with a system such as W-CDMA where this signal is not provided, the device of the present invention is unable to provide separate values for the two cases mentioned above. However, a device which operates in a W-CDMA system uses a current which tends to have lower peak values than a device operating in a GSM system. Therefore, the absence of a signal which indicates whether the transmitter is active is relatively unimportant, because it is less important in this case to measure the voltage at a higher rate during transmissions.

For a dual mode device, for example operating in the GSM system and in a system such as W-CDMA which does not provide a signal indicating whether the transmitter is active, two separate output values can be provided. However, an output value stored at a time when the transmitter active signal is not present may for example represent a voltage supplied at a time when the transmitter is active in the W-CDMA mode, in which no such signal is provided.

In step 110, it is determined whether the transmitter active signal TXON is detected. If the transmitter active signal TXON is detected, the process passes to step 112, and the third register 75, storing the minimum battery voltage supplied while the transmitter active signal is supplied, $VBAT_{min}$ @ TXON, is updated. If, on the other hand, the transmitter active signal TXON is not supplied, the process passes to step 114, and the fourth register 76, storing the minimum battery voltage supplied at a time when the transmitter active signal is not provided, $VBAT_{min}$ @ no TXON, is updated, if the currently measured battery voltage falls below that value.

If, at step 102, it is determined that the slot is not the first slot in a set of 10, the process passes to step 116, where it is then determined whether the slot is the last slot in a set of 10. If it is not, the process passes to step 118. As before, it is determined whether the transmitter active signal TXON is being supplied. If it is not, the process passes to step 119, in which it is determined whether or not to make a measurement during that slot. This determination is made on the basis of an adjustable user setting. If the setting is that no measurement is to be made when there is no TXON signal, the process returns to the start and awaits a new slot.

However, if it is determined in step 119 that a measurement should be made, or if it is determined in step 118 that the transmitter is active, the process passes to step 120, in which the battery voltage is measured.

As previously described, this measured voltage VBAT is compared with the value currently stored in the first register 73 and, if it exceeds that stored value, the value stored in the register is updated, step 122. Similarly, the value is compared with the value stored in the third register 75 and, if it is lower than the stored value, it is used to update the stored value at step 112.

If it is determined at step 116 that the current slot is the last slot of 10, the procedure passes to step 124, where it is determined whether the battery is being charged. If it is not, no measurement is taken and the procedure awaits a new slot. If the battery is being charged, however, the charge current is measured at step 126, and the measured value is used, as appropriate, to update the values stored in the fifth, sixth and seventh registers 77, 78, 79, which store the maximum charging current Imax, the minimum charging current Imin, and the average charging current Iave, at step 128.

These values stored in the register can then be accessed by the CPU 40 as required, for example, only once every second.

This has the advantage, as stated earlier, that the CPU 40 does not have to read a large number of values, in order to obtain the information required about the parameters.

When a stored maximum or minimum value is read from a register by the CPU, the value stored in that register is reset. Thus, the stored value in the register is the maximum or minimum value of the parameter (as the case may be) since the CPU last read a stored value.

In the same way as the parameters mentioned above, it is possible to measure other parameters, such as the temperature of the battery, or of any other component to which the monitoring device may be connected, and to store maximum, minimum, and average values of the temperature or other parameter in registers in the monitoring device. Again, these parameter values can be accessed by the CPU 40 at any rate considered appropriate. Since the temperature is a relatively slowly varying value, it may not be necessary to monitor the values of the parameters relating to temperature often.

As described in United Kingdom Patent Application No. 0014840.3, the monitoring device 60 can further include a function which allows a threshold value to be set for any or all of the parameters which are measured by the device. When any parameter reaches its corresponding threshold value, an interrupt signal is sent to the CPU 40. This means that the CPU may need to monitor the parameter values less often, because it will still be informed promptly whenever a threshold value is reached. This can therefore reduce still further the requirement for communications on the bus.

There is therefore provided a monitoring device which has the result that communications on the bus are reduced, and power consumption is reduced. Moreover, the device is capable of operating in systems with no internal transmit signal, such as W-CDMA.

What is claimed is:

1. A monitoring device, for allowing a processor to monitor a value of a parameter derived from an analog signal, the monitoring device comprising:
   an analog-digital converter, for producing a digital signal corresponding to the analog signal, wherein said digital signal comprises a digital signal stream, corresponding to successive measured values of the parameter;
   a logic unit, for obtaining at least one value of said parameter, based on the digital signal, said logic unit being adapted for updating the value of the or each parameter contained in the register as required in response to the digital signal stream; and
   an output register, accessible by the processor unit, the register containing at least one said obtained value of said parameter derived from said digital signal stream.

2. A monitoring device as claimed in claim 1, wherein the monitoring device further comprises means for setting a threshold value for said parameter, and for sending a signal to said processor when a parameter value contained in the output register reaches the threshold value.

3. A monitoring device, as claimed in claim 1, wherein:
   said monitoring device is adapted for connection to a battery; and
   said parameter derived from said analog signal comprises a voltage supplied by the battery.

4. A monitoring device as claimed in claim 3, wherein the register contains the maximum value of the battery voltage supplied over a period since the register was last accessed by the processor.

5. A monitoring device as claimed in claim 3, wherein the register contains the minimum value of the battery voltage supplied over a period since the register was last accessed by the processor.

6. A monitoring device as claimed in claim 3, wherein the register contains the average value of the battery voltage supplied over a fixed period.

7. A monitoring device a claimed in claim 1, wherein:
   said monitoring device is adapted for connection to a battery; and
   said parameter derived from said analog signal comprises a charging current supplied to the battery.

8. A monitoring device as claimed in claim 7, wherein the register contains the maximum value of the charging current supplied over a period since the register was last accessed by the processor.

9. A monitoring device as claimed in claim 7, wherein the register contains the minimum value of the charging current supplied over a period since the register was last accessed by the processor.

10. A monitoring device as claimed in claim 7, wherein the register contains the average value of the charging current supplied over a period.

11. A mobile communications device, comprising a monitoring device as claimed in claim 7, wherein the processor is a processor of the mobile communication device.

12. A mobile communications device, comprising a monitoring device as claimed in claim 3, wherein the processor is a processor of the mobile communications device.

13. A mobile communications device as claimed in claim 12, wherein the register contains the maximum value of the battery voltage supplied over a period and the average value of the battery voltage supplied over a period.

14. A mobile communications device as claimed in claim 13, wherein the maximum value of the battery voltage supplied over a period is updated at a first rate, and the average value of the battery voltage supplied over a period is updated at a second rate slower than the first rate.

15. A mobile communications device as claimed in claim 13, which, in at least one mode of operation, produces an internal signal indicating that the device is transmitting, and wherein the stored maximum value of the battery voltage is updated at a first rate while said internal signal is being produced, and at a second lower rate while said internal signal is not being produced.

16. A mobile communications device as claimed in claim 12, wherein the register contains the minimum value of the battery voltage supplied over a period and the average value of the battery voltage supplied over a period.

17. A mobile communications device as claimed in claim 16, wherein the minimum value of the battery voltage supplied over a period is updated at a first rate, and the average value of the battery voltage supplied over a period is updated at a second rate slower than the first rate.

18. A mobile communications device as claimed in claim 16, which, in at least one mode of operation, produces an internal signal indicating that the device is transmitting, and wherein the stored minimum value of the battery voltage is updated at a first rate while said internal signal is being produced, and at a second lower rate while said internal signal is not being produced.

19. A mobile communications device as claimed in claim 12, which, in at least one mode of operation, produces an internal signal indicating that the device is transmitting, and wherein the register contains a first minimum value of the battery voltage supplied over a period while said internal signal is being produced, and a second minimum value of the battery voltage supplied over a period while said internal signal is not being produced.

20. A monitoring device as claimed in claim 1, wherein:
   said monitoring device is adapted for connection to a battery; and
   said parameter derived from said analog signal comprises a temperature.

21. A monitoring device as claimed in claim 20, wherein the register contains the maximum value of the temperature supplied over a period since the register was last accessed by the processor.

22. A monitoring device as claimed in claim 20, wherein the register contains the minimum value of the temperature supplied over a period since the register was last accessed by the processor.

23. A monitoring device as claimed in claim 20, wherein the register contains the average value of the temperature supplied over a fixed period.

24. A method of monitoring a value of a parameter derived from an analog signal, the method comprising:

producing a digital signal corresponding to the analog signal, wherein said digital signal comprises a digital signal stream, corresponding to successive measured values of the parameter;

obtaining at least one value of said parameter, based on the digital signal; and storing at least one said obtained at least one value derived from said digital stream in an output register, accessible by a processor unit.

25. A method as claimed in claim 24, further comprising setting a threshold value for said parameter, and for sending a signal to said processor when the value of the parameter reaches the threshold value.

26. A method of monitoring as claimed in claim 24, wherein said parameter comprises a voltage supplied by a battery.

27. A method as claimed in claim 26, comprising updating the value of the or each parameter contained in the register as required in response to the digital stream.

28. A method as claimed in claim 27, wherein the register contains the maximum value of the battery voltage supplied over a period since the register was last accessed by the processor.

29. A method as claimed in claim 27, wherein the register contains the minimum value of the battery voltage supplied over a period since the register was last accessed by the processor.

30. A method of monitoring as claimed in claim 24, wherein said parameter comprises a charging current supplied to a battery.

31. A method as claimed in claim 27, wherein the register contains the average value of the battery voltage supplied over a fixed period.

32. A method as claimed in claim 30, comprising updating the value of the or each parameter contained in the register as required in response to the digital signal stream.

33. A method as claimed in claim 32, comprising storing in the register the maximum value of the charging current supplied over a period since the register was last accessed by the processor.

34. A method of monitoring as claimed in claim 24, wherein said parameter comprises a temperature.

35. A monitoring device as claimed in claim 32, comprising storing in the register the minimum value of the charging current supplied over a period since the register was last accessed by the processor.

36. A method as claimed in claim 32, comprising storing in the register the average value of the charging current supplied over a period.

37. A method as claimed in claim 34, comprising updating the value of the or each parameter contained in the register as required in response to the digital signal stream.

38. A monitoring device as claimed in claim 1, wherein said digital signal comprises a digital signal stream, and said logic unit adapted for updating the value of the or each parameter contained in the register as required in response to the digital stream.

39. A monitoring device as claimed in claim 1, wherein the register contains the maximum value of the parameter supplied over a period and the average value of the parameter supplied over a period.

40. A monitor device as claimed in claim 39, wherein the maximum value of the parameter supplied over a period is updated at a first rate, and the average value of the parameter supplied over a period is updated at a second rate slower than the first rate.

41. A monitoring device as claimed in claim 1, wherein the register contains the minimum value of the parameter supplied over a period and the average value of the parameter supplied over a period.

42. A monitoring device as claimed in claim 41, wherein the minimum value of the parameter supplied over a period is updated at a second rate slower than the first one.

43. A monitoring device as claimed in claim 1, wherein the register contains the maximum value of the parameter supplied over a period since the register was last accessed by the processor.

44. A monitoring device as claimed in claim 1, wherein the register contains the minimum value of the parameter supplied over a period since the register was last accessed by the processor.

45. A monitoring device as claimed in claim 1, wherein the register contains the average value of the parameter supplied over a fixed period.

46. A method as claimed in claim 24, comprising updating the value of the or each parameter contained in the register as required in response to the digital signal stream.

47. A monitoring device as claimed in claim 37, comprising storing in the register the maximum value of the temperature supplied over a period since the register was last accessed by the processor.

48. A method as claimed in claim 37, comprising storing in the register the minimum value of the temperature supplied over a period since the register was last accessed by the processor.

49. A method as claimed in claim 37, comprising storing in the register the average value of the temperature supplied over a fixed period.

50. A mobile communications device, comprising a monitoring device as claimed in claim 20.

51. A mobile communications device as claimed in claim 12, said monitor monitoring a parameter derived from a second analog signal corresponding to a charging current supplied by the battery, wherein:

said second analog signal is digitized by said analog-digital converter for producing information in said digital signal stream corresponding to successive measurements of the charging current;

said output register contains values of output parameters derived from said digital signal stream, said values corresponding to said voltage and current measurements; and said logic unit is adapted for updating the value of each of the output parameters contained in the register as required in response to said digital signal stream.

* * * * *